(12) United States Patent
Komposch et al.

(10) Patent No.: US 9,209,116 B1
(45) Date of Patent: Dec. 8, 2015

(54) SEMICONDUCTOR DEVICE PACKAGE HAVING ASYMMETRIC CHIP MOUNTING AREA AND LEAD WIDTHS

(71) Applicant: Infineon Technologies AG, Neubiberg (DE)

(72) Inventors: Alexander Komposch, Morgan Hill, CA (US); Soon Ing Chew, Milpitas, CA (US); Herman Hugo, San Jose, CA (US); Simon Ward, Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/297,189

(22) Filed: Jun. 5, 2014

Related U.S. Application Data

(60) Provisional application No. 62/002,348, filed on May 23, 2014.

(51) Int. Cl.
*H03F 1/07* (2006.01)
*H01L 23/495* (2006.01)
*H03F 3/195* (2006.01)
*H03F 3/213* (2006.01)
*H03F 1/30* (2006.01)

(52) U.S. Cl.
CPC .... *H01L 23/49517* (2013.01); *H01L 23/49503* (2013.01); *H01L 23/49575* (2013.01); *H03F 1/30* (2013.01); *H03F 3/195* (2013.01); *H03F 3/213* (2013.01); *H03F 2200/447* (2013.01); *H03F 2200/451* (2013.01)

(58) Field of Classification Search
CPC ....... H03F 1/07; H03F 1/0288; H03F 1/3252; H03F 3/187
USPC .................. 330/295, 124 R, 84, 126, 307
See application file for complete search history.

(56) References Cited

U.S. PATENT DOCUMENTS

| | | | | |
|---|---|---|---|---|
| 6,388,528 | B1 * | 5/2002 | Buer et al. ..................... | 330/295 |
| 7,705,684 | B2 * | 4/2010 | Degani et al. ................. | 330/307 |
| 8,710,928 | B2 * | 4/2014 | Ng ................................ | 330/307 |
| 2002/0036541 | A1 * | 3/2002 | Buer ............................. | 330/295 |

OTHER PUBLICATIONS

Unknown, Author , "RF Power LDMOS Transistors", Freescale Semiconductor Technical Data Sheet, Sep. 2013, pp. 1-18, Revision 1, Document No. AFT09H310-03S.
Unknown, Author , "RF Power Product Selection Guide : LDMOS Transistors and ICs", Feb. 2014, pp. 1-6, Infineon Technologies AG.

* cited by examiner

*Primary Examiner* — Henry Choe
(74) *Attorney, Agent, or Firm* — Murphy, Bilak & Homiller, PLLC

(57) ABSTRACT

A semiconductor device package includes a solid metal base with a top surface and an electrically conductive chip mounting area on the top surface. First and second pairs of conductive leads are attached to the base and extend away from one another in opposite directions. First and second amplifiers are attached to the top surface and are electrically connected to the first and second pairs of leads. The first pair is separated from the second pair by a horizontal gap between inner edge sides of the leads. A reference line in the horizontal gap that extends perpendicular to edges of the base divides the chip mounting area into first and second chip mounting sections. An area of the first chip mounting section is smaller than an area of the second chip mounting section. The first and second leads have a smaller width than the third and fourth leads.

16 Claims, 3 Drawing Sheets

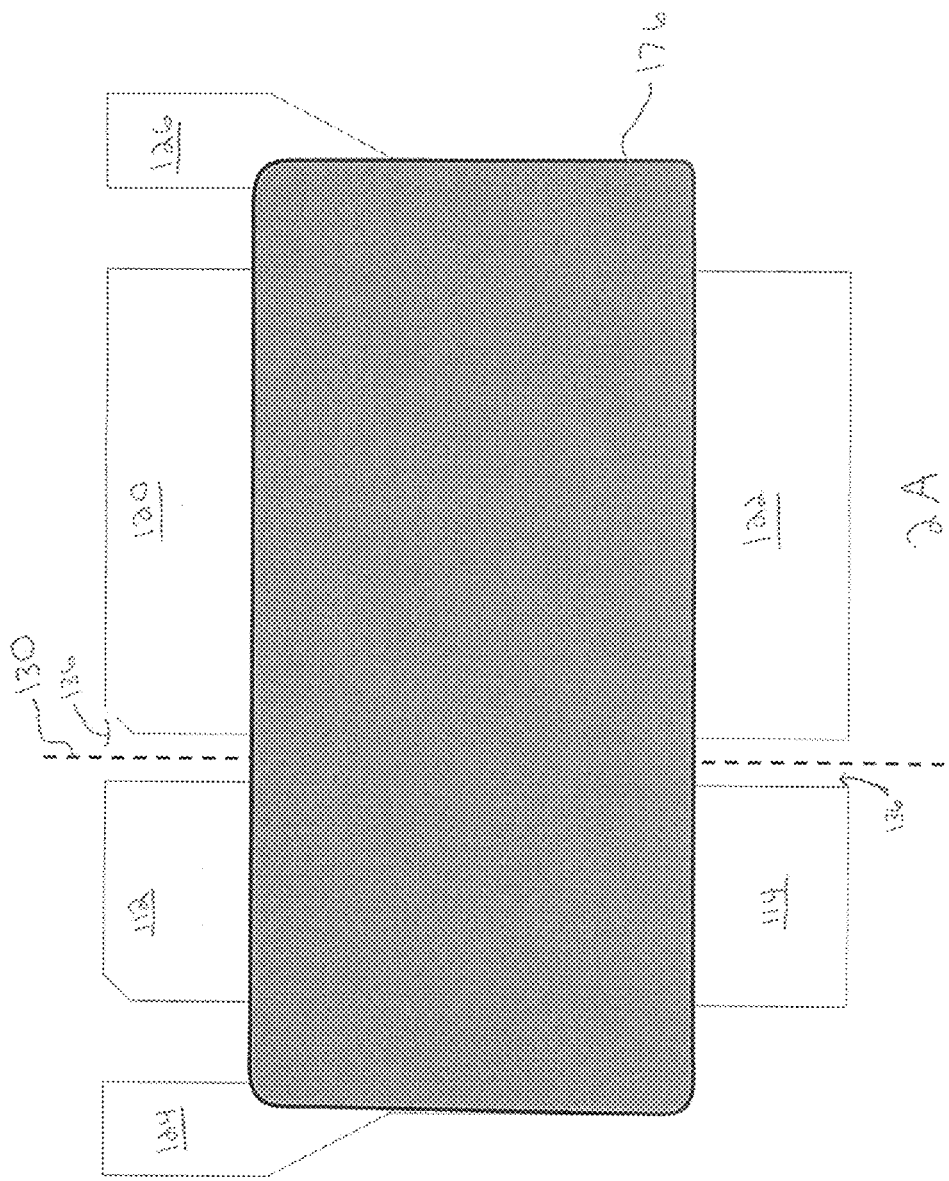

SEMICONDUCTOR DEVICE PACKAGE HAVING ASYMMETRIC CHIP MOUNTING AREA AND LEAD WIDTHS

PRIORITY CLAIM

This application claims the benefit of and priority to U.S. Provisional Application Ser. No. 62/002,348, filed 23 May 2014. The entire contents of said U.S. Provisional Application are incorporated herein by reference.

TECHNICAL FIELD

The present invention generally relates to semiconductor device packaging and more particularly relates to tailoring the chip mounting area and lead width of a device package to the different die sizes of a multipath amplifier.

BACKGROUND

Semiconductor packages are commonly utilized in integrated circuit applications. One common semiconductor device package arrangement includes a substrate that acts as a heat sink and lid that can be placed over the substrate so as to form an internal cavity over the substrate. Integrated circuits, such as semiconductor chips, as well as other electrical components, may be placed within the cavity and electrically connected to conductive leads that extend out from the base. The conductive leads enable electrical connection between the package and a receptacle, such as a printed circuit board. Thus, the packaged arrangement allows for easy electrical connection between the circuits to external devices while simultaneously protecting the semiconductor chip and electrical connections from damaging environmental conditions, such as moisture, particles, etc.

Package designers are constantly seeking to improve packaging designs. One notable design consideration is the total footprint of the package. Reducing the total footprint of the package may beneficially reduce the size and/or cost of the item incorporating the packaged device. Two parameters that substantially influence the total footprint of the package are the size of the substrate and the size of the leads. That is, one can reduce the total footprint of the package by reducing the size of these features. However, reducing the size of these features introduces further design complications. The substrate must maintain a sufficient size to accommodate the die area of the semiconductor devices. Further, the leads must maintain a sufficient cross-sectional area to accommodate the electrical currents associated with the packaged electrical devices. Thus, the physical and electrical requirements of the packaged devices inhibit the ability to reduce the total footprint of the package.

SUMMARY

According to one embodiment, a semiconductor device package is disclosed. The semiconductor device package includes a solid metal base with a top surface and an electrically conductive chip mounting area on the top surface. A first pair of conductive leads is attached to and insulated from the base. The first pair includes first and second leads extending away from one another such that the first lead extends laterally beyond a first edge of the base and the second lead extends laterally beyond a second edge of the base opposite the first edge. A second pair of conductive leads is attached to and insulated from the base. The second pair includes third and fourth leads extending away from one another such that the third lead extends laterally beyond the first edge and the fourth lead extends laterally beyond the second edge. A first amplifier is attached to the top surface and includes a first terminal electrically connected to the first lead and a second terminal electrically connected to the second lead. A second amplifier is attached to the top surface and includes a first terminal electrically connected to the third lead and a fourth terminal electrically connected to the second lead. The first pair is separated from the second pair by a horizontal gap between inner edge sides of the first and third leads and between inner edge sides of the second and fourth leads. A reference line in the horizontal gap that extends perpendicular to the first and second edges of the base divides the chip mounting area into first and second chip mounting sections. An area of the first chip mounting section is smaller than an area of the second chip mounting section. The first and second leads have a smaller width than the third and fourth leads.

According to another embodiment, a packaged Doherty amplifier is provided. The amplifier includes a solid metal base with a top surface and an electrically conductive chip mounting area on the top surface. The chip mounting area is divided into first and second chip mounting sections. A main amplifier is affixed to the top surface within the first area. A peaking amplifier is affixed to the top surface within the second area. First and second conductive leads are electrically connected to gate and drain terminals of the main amplifier. The first and second leads laterally extend away from the base in opposite directions. Third and fourth conductive leads are electrically connected to gate and drain terminals of the peaking amplifier. The third and fourth leads laterally extend away from the base in opposite directions. A die area of the main amplifier is less than a die area of the peaking amplifier. A die width of the main amplifier is less than a die width of the peaking amplifier. An area of the first chip mounting section corresponds to the die area of the main amplifier and an area of the second chip mounting section corresponds to the die area of the peaking amplifier. A width of the first and second leads corresponds to the die width of the main amplifier and a width of the third and fourth leads corresponds to the die width of the peaking amplifier.

According to another embodiment, a packaged RF power amplifier is provided. The amplifier includes a solid metal base with a top surface and an electrically conductive chip mounting area on the top surface. The chip mounting area is divided into first and second chip mounting sections. A first amplifier is affixed to the top surface within the first area. A second amplifier is affixed to the top surface within the second area. First and second conductive leads are electrically connected to gate and drain terminals of the first amplifier. The first and second leads laterally extend away from the base in opposite directions. Third and fourth conductive leads are electrically connected to gate and drain terminals of the second amplifier. The third and fourth leads laterally extend away from the base in opposite directions. A die area of the first amplifier is less than a die area of the second amplifier. A die width of the first amplifier is less than a die width of the second amplifier. An area of the first chip mounting section corresponds to the die area of the first amplifier and an area of the second chip mounting section corresponds to the die area of the second amplifier. A width of the first and second leads corresponds to the die width of the first amplifier and a width of the third and fourth leads corresponds to the die width of the second amplifier.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B depicts top-down and side-view perspectives of the semiconductor device package with a lid affixed to the surface so as to provide an interior cavity over the multipath amplifier, according to an embodiment.

DETAILED DESCRIPTION

Embodiments described herein provide a semiconductor package that may be used to efficiently accommodate two or more integrated circuits having a substantial difference in area consumption and/or current carrying requirements. One example of such an arrangement is a Doherty amplifier, which is a multipath amplifier. A Doherty amplifier configuration includes a peaking amplifier and a main amplifier. Under lower power operating ranges, the main amplifier is operational whereas the peaking amplifier is off. Above a certain power threshold, the peaking amplifier becomes operational. As the two amplifiers operate under different power ranges, there is typically a difference in chip area between the main and peaking amplifier. For instance, the chip area of the peaking amplifier may be twice the size as the main amplifier. Further, the difference in power ranges may result in different current requirements between the two amplifiers. Thus, the optimal lead size for one of the amplifiers may be less than optimal for the other amplifier.

Advantageously, the embodiments described herein provide a semiconductor package that asymmetrically allocates the die mounting area and lead sizes in proportion to the area consumption and current carrying requirements of two different integrated circuits. That is the die mounting area and lead size for the two integrated circuits are not identical. For instance, in a Doherty amplifier having a peaking amplifier that is larger than the main amplifier, the die mounting area and lead sizes are different, and correspond to the respective requirements of the peaking and main amplifiers. Consequently, the overall footprint of the packaged Doherty amplifier may be reduced in comparison to package designs that symmetrically allocate die mounting area and lead sizes without regard to the dimensions of different sized amplifiers.

Figure 1:
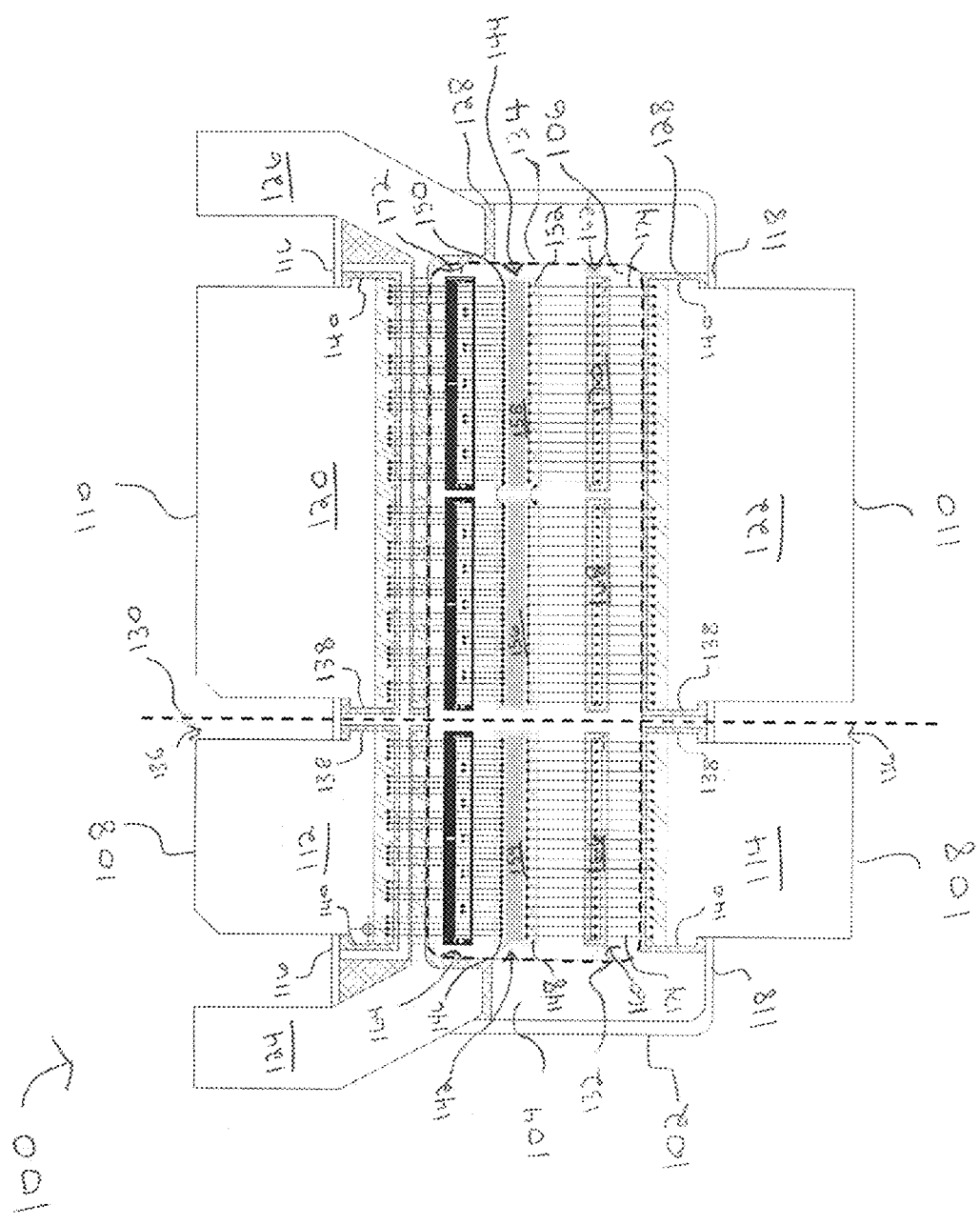
FIG. 1 depicts a top-down view perspective of a semiconductor device package electrically connected a multipath amplifier, according to an embodiment.

Referring to FIG. 1, an embodiment of a semiconductor device package 100 is depicted. The package 100 includes a solid metal base 102 having a top surface 104. The solid metal base 102 may be formed from copper, aluminum and similar materials that provide thermal conduction. According to an embodiment, the solid metal base 102 is configured as a heat sink so as to dissipate heat away from devices arranged on top surface 104. Alternatively, the solid metal base 102 may be formed from a thermally insulating material. An electrically conductive chip mounting area 106 is formed on the top surface 104. The electrically conductive chip mounting area 106 may be formed from an electrically conductive material, such as copper, aluminum and the like.

First and second pairs 108, 110 of leads laterally extend away from the package 100. A lateral direction refers to a direction parallel to the top surface 104. The package 100 may be situated on a receptacle, such as a printed circuit board, so that the top surface 104 is separated from the receptacle in a vertical direction that is perpendicular to the lateral direction. The leads laterally extend away from the base 102 to allow for an electrical connection with the receptacle.

The first pair 108 includes first and second leads 112, 114 extending away from one another such that the first lead 112 extends laterally beyond a first edge 116 of the base 102 and the second lead 114 extends laterally beyond a second edge 118 of the base opposite the first edge 116. In a similar manner, the second pair 110 includes third and fourth leads 120, 122 extending away from one another such that the third lead 120 extends laterally beyond the first edge 116 and the fourth lead 122 extends laterally beyond the second edge 118. The first and second pairs 108, 110 are adjacent to one another. That is, the semiconductor device package 100 is configured with at least four leads, with the first and third leads 112, 120 extending away from the base 102 in an opposite direction as the second and fourth leads 114, 122. FIG. 1 additionally depicts two additional leads 124, 126 extending away from the package 100. These additional leads 124, 126 may be used to provide a DC signal to the devices mounted on the chip mounting area 106. Optionally, the leads 124, 126 may be connected to conductors extending along the top surface 104 near a side of the chip mounting area 106 to minimize the distance of the electrical connection between the DC signal and the devices. The leads 124, 126 are optional and the package 100 may be provided without them.

Each of the leads 112, 114, 120 and 122 of the first and second pair 108, 110 are attached to and insulated from the base 102. According to an embodiment, an insulating film 128 is provided on the top surface 104 in regions outside of the chip mounting area 106. The first, second, third and fourth leads 112, 114, 120 and 122 may adjoin the insulating film 128 and be insulated from the chip mounting area 106.

The first and second pair 108, 110 of leads can be used as reference points to divide the chip mounting area 106 into two distinct mounting sections. The first and second pair 108, 110 are arranged so that electrical components can be placed in between and electrically connected to the opposite facing leads (112 and 114 or 120 and 122). A reference line 130 can be drawn between the first and second pair 108, 110 that divides the chip mounting area 106 into first and second chip mounting sections 132, 134. As shown in FIG. 1, the reference line 130 extends along the lateral direction perpendicular to the first and second edges 116, 118 of the base 102. The reference line 130 is in a horizontal gap 136 that separates the first pair 108 from the second pair 110. The horizontal gap 136 is between inner edge sides 138 of the first and third leads 112, 120 and between inner edge sides 138 of the second and fourth leads 114, 122. Thus, all of the chip mounting area 106 on the left side of the reference line 130 (from the perspective of FIG. 1) represents the first mounting section 132. All of the chip mounting area 106 on the right side of the reference line 130 (from the perspective of FIG. 1) represents the second mounting section 134.

The first and second chip mounting sections 132, 134 have different dimensions so as to accommodate differently dimensioned electrical devices between the opposite facing leads (112 and 114 or 120 and 122) in a space-efficient manner. Further, the first and second leads 112, 114 have different dimensions than the third and fourth leads 120, 122. This difference allows each pair 108, 110 of leads to physically align with the devices that the leads 112, 114, 120, 122 are connected to and allows for each pair 108, 110 of leads to have a current-carrying capacity that is proportional to the dimensions of the differently dimensioned electrical devices.

According to an embodiment, the area of the first chip mounting section 132 is smaller than the area of the second chip mounting section 134. Further, the first and second leads 112, 114 have a smaller width than the third and fourth leads 120, 122. The width of the leads is measured as maximum separation distance between an inner edge side 138 and an outer edge side 140 in a direction perpendicular to the reference line 130. Alternatively, the area of the first chip mounting section 132 may be larger than the area of the second chip mounting section 134 and the first and second leads 112, 114 may have a larger width than the third and fourth leads 120, 122.

FIG. 1 further depicts first and second amplifiers 142, 144 attached to the top surface 104 in the chip mounting area 106. The first amplifier 142 includes a first terminal 146 electrically connected to the first lead 112 and a second terminal 148 electrically connected to the second lead 114. Likewise, the second amplifier 144 includes a first terminal 150 electrically connected to the third lead 120 and a second terminal 152 electrically connected to the second lead 122. Electrically connected refers to a direct electrical connection between the two terminals, without an intervening component that disrupts the flow of current in either direction. The first amplifier 142 may be arranged completely within the first mounting section 132. That is, no part of the first amplifier 142 extends into the second mounting section 134. Similarly, the second amplifier 146 may be arranged completely within the second mounting section 134.

According to an embodiment, the first and second amplifiers 142, 144 are configured as an RF (radio frequency) power amplifier. For instance, the first and second amplifiers 142, 144 may be configured as a Doherty amplifier, wherein the first amplifier 142 is the main amplifier and wherein the second amplifier 144 is the peaking amplifier. The main amplifier can be formed from a first die 154 and the peaking amplifier can be formed from second and third dies 156, 158. That is, the peaking amplifier can be formed from two dies 156, 158 having common input/output connections. The package 100 can accommodate the dies 154, 156, 158 in a source-down configuration. According to an embodiment, each of the first, second and third dies 154, 156, 158 comprise source terminals on a bottom side that are electrically connected to the chip mounting area 106. That is, the chip mounting area 106 can form a common source terminal that electrically connects to all of the dies 154, 156, 158 in the Doherty amplifier. A gate terminal of the first die 154, which may be second terminal 148, can be electrically connected to the second lead 114 and a drain terminal of the first die 154, which may be the first terminal 146, can be electrically connected to the first lead 112. Gate terminals of the second and third dies 156, 158, which may be the second terminal 152, can be electrically connected to the fourth lead 122 and drain terminals of the second and third dies 156, 158, which may be the first terminal 150, can be electrically connected to the third lead 120.

As can be seen from FIG. 1, a die area of the first amplifier 142 (i.e. the main amplifier) is less than a die area of the second amplifier 144 (i.e. the peaking amplifier). According to an embodiment, each of the first, second and third dies 154, 156, 158 are substantially identical in size such that a ratio between total die area of the peaking amplifier to the main amplifier is approximately 2 to 1. That is, the amount of mounting space collectively required by the second and third dies 156, 158 is approximately twice the size of the mounting space required by the first die 154. Alternatively, the peaking amplifier can be formed from a single die that is differently sized than the first die 154 of the main amplifier. This leads to a similar discrepancy in die area between the peaking and main amplifier. The ratio between total die area of the peaking and main amplifier may vary, depending on application requirements. Further, the main amplifier may require a larger die area than the peaking amplifier. That is, the ratio between total die area of the peaking to the main amplifier may be approximately 1 to 2.

According to an embodiment, the area of the first chip mounting section 132 corresponds to the die area of the main amplifier and the area of the second chip mounting 134 section corresponds to the die area of the peaking amplifier. As used herein, the term "corresponds to" describes a direct relationship between the dimensions of two items. For instance, the die area of the main amplifier can be correlated to the area of the first chip mounting section 132 by a ratio of 1 to 4. The width of the main amplifier can be approximately the same as the width of the first chip mounting section 132, whereas the height of the main amplifier can be approximately four times less than the height of the first chip mounting section 132. If a larger main amplifier is required, the ratio of 1 to 4 can be maintained by proportionally increasing the area of the first chip mounting section 132 (e.g. by increasing the width). Other ratios of correspondence are possible, provided that there is dependence between the dimensions of the items.

According to an embodiment, a ratio between the area of the second and first chip mounting sections 132, 134 is identical or substantially close to a ratio between the area of the main and peaking amplifier. For instance, each of the first, second and third dies 154, 156, 158 may be substantially identical in size such that a ratio between total die area of the peaking and main amplifier is approximately 2 to 1. Likewise, a ratio between the area of the second and first chip mounting sections 132, 134 can be approximately 2 to 1.

According to an embodiment, the width of the first and second leads 112, 114 corresponds to the die width of the main amplifier. Further, the width of the third and fourth leads 120, 122 can correspond to the die width of the peaking amplifier. The die width of the main amplifier can be less than a die width of the peaking amplifier. According to an embodiment, the die width of the main amplifier corresponds to a width of the first die 154 and the die width of the peaking amplifier corresponds to a collective width of the second and third dies 156, 158.

Further, the ratio of lead widths can correspond to or be identical to the ratio of die widths. This relationship assumes that both of the leads 112, 114 and 120, 122 in each pair 108, 110 have identical widths with respect to one another. In the event that the first, second and third dies have substantially identical dimensions, the ratio of die width of the peaking amplifier to die width of the main amplifier is approximately 2 to 1. Likewise, the ratio of the width of the third and fourth leads 120, 122 to the width of the first and second leads 112, 114 is approximately 2 to 1.

Advantageously, the tailoring of lead width and chip mounting area 106 described above provides a semiconductor package 100 that is tailored to the dimensions of the differently sized amplifiers 142, 144. Due to the correlating relationships, the chip mounting area 106 can be reduced to a minimum size as there is no wasted space in either of the first and second chip mounting sections 132, 134. Further, the size of the leads can be optimized as the wider leads (e.g. 120 and 122) are provided for the amplifier having higher power requirements whereas the narrower leads (e.g. 112 and 114) are provided for the amplifier having lesser power requirements. As a result, the overall footprint of the packaged device can be reduced.

In addition to the semiconductor dies 154, 156, 158, the package 100 depicted in FIG. 1 includes input and output matching networks. More particularly, a first input matching network 160 is electrically connected to the gate terminal 148 of the first die 154 and a second input matching network 162 is electrically connected to the gate terminals 152 of the second and third dies 156, 158. The first input matching network 160 may be formed from a first capacitor 166 electrically connected to the second lead 114 and to the gate terminal 148 of the first die. Similarly, the second input matching network 162 may be formed from second and third capacitors 168, 170 electrically connected to the fourth lead 122 and to the gate terminals 152 of the second and third dies 156, 158. A first output matching network 164 is electrically connected to the drain terminal 146 of the first die 154 and a second output matching network 172 is electrically connected to the drain terminals 150 of the second and third dies 156, 158.

The first input matching network 160 and the first output matching network 164 may be arranged completely within the first chip mounting section 132 and the second input matching network 162 and the second output matching network 172 may be arranged completely within the second chip mounting section 134. The dimensions of elements in the input matching networks 160, 162 (e.g. the first second and third capacitors, 166, 168, 170) may be correlated to the dimensions of the first and second amplifiers 142, 144. Thus, the advantages of the above described correlations between the dimensions of the chip mounting sections 132, 134 and lead widths with the dimensions of the first and second amplifiers 142, 144 can be maintained.

The electrical connections described herein may be provided by copper conductors. According to an embodiment, the electrical connections between the first and second input matching networks 160, 162, the first and second output matching networks 164, 172 and the respective gate and drain terminals 146, 148, 150, 152 of the first, second and third dies 154, 156, 158 are formed from bonding wires 174. The bonding wires 174 may be configured as inductors that provide the required inductance of the input and output matching networks 160, 162, 164, 172.

Figure 2:
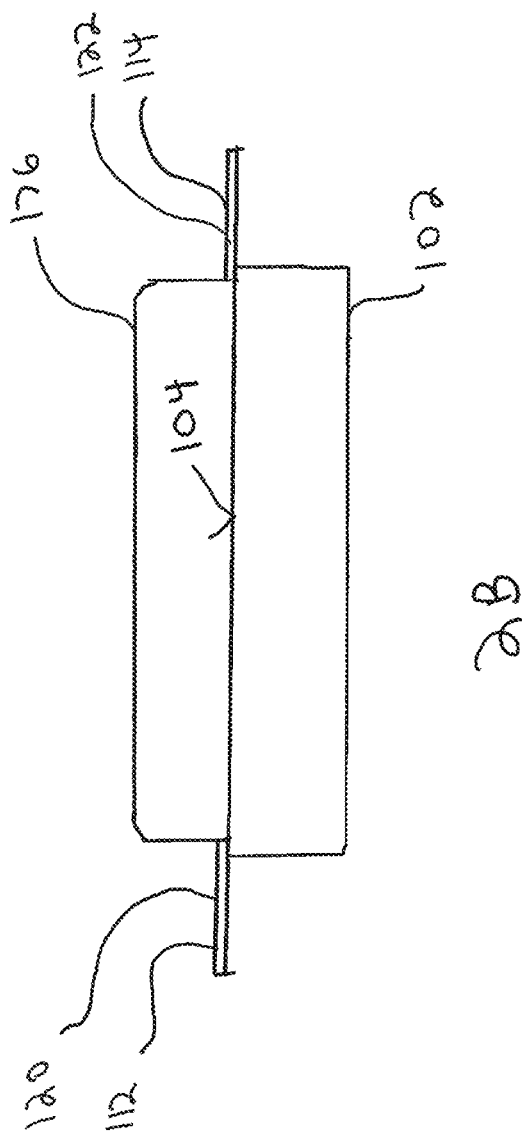
FIG. 2 including

Referring to FIG. 2, the semiconductor package 100 is depicted with a lid 176 adjoining the top surface 104. FIG. 2A depicts the package 100 from a top-down perspective and FIG. 2B depicts the package 100 from a side-view perspective. The lid 176 provides an interior cavity that surrounds and protects the electrical connections. The interior cavity may remain unfilled (i.e. air-filled) or optionally may be filled with a commonly known potting compound that insulates and protects the devices. The first, second and third dies, 154, 156, 158, the first and second input and output matching networks 160, 162, 164, 172 and the bonding wires 174 are arranged within the interior cavity and covered by the lid 176. That is, the semiconductor package 100 depicted in FIG. 2 is not a molded package with a molded plastic material adjoining the devices.

The term "substantially" encompasses relationships or physical features of the elements that are both exactly in conformity with the requirement as well as minor deviations from the requirements due to process variation, assembly and other factors that may cause a deviation from the ideal. The term "approximately" encompasses relationships or physical features of the elements that are close to, but not necessarily exactly the same in value, such that one of ordinary skill could use the elements described herein according to the functions and specifications described herein.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device package, comprising:
   a solid metal base comprising a top surface;
   an electrically conductive chip mounting area on the top surface;
   a first pair of conductive leads attached to and insulated from the base, the first pair comprising first and second leads extending away from one another such that the first lead extends laterally beyond a first edge of the base and the second lead extends laterally beyond a second edge of the base opposite the first edge;
   a second pair of conductive leads attached to and insulated from the base, the second pair comprising third and fourth leads extending away from one another such that the third lead extends laterally beyond the first edge and the fourth lead extends laterally beyond the second edge;
   a first amplifier attached to the top surface and comprising a first terminal electrically connected to the first lead and a second terminal electrically connected to the second lead; and
   a second amplifier attached to the top surface and comprising a first terminal electrically connected to the third lead and a second terminal electrically connected to the fourth lead,
   wherein the first pair is separated from the second pair by a horizontal gap between inner edge sides of the first and third leads and between inner edge sides of the second and fourth leads,
   wherein a reference line in the horizontal gap that extends perpendicular to the first and second edges of the base divides the chip mounting area into first and second chip mounting sections,
   wherein an area of the first chip mounting section is smaller than an area of the second chip mounting section, and
   wherein the first and second leads have a smaller width than the third and fourth leads.

2. The semiconductor device package of claim 1, wherein the first and second amplifiers are configured as an RF power amplifier.

3. The semiconductor device package of claim 2, wherein the first and second amplifiers are configured as a Doherty amplifier, wherein the first amplifier is a main amplifier and wherein the second amplifier is a peaking amplifier.

4. The semiconductor device package of claim 3, wherein the main amplifier comprises a first die arranged within the first chip mounting section, and wherein the peaking amplifier comprises second and third dies arranged within the second chip mounting section.

5. The semiconductor device package of claim 4, wherein each of the first, second and third dies comprise source terminals electrically connected to the chip mounting area, wherein the first die comprises a gate terminal electrically connected to the second lead and a drain terminal electrically connected to the first lead, and wherein the second and third dies comprise gate terminals electrically connected to the fourth lead and drain terminals electrically connected to the third lead.

6. The semiconductor device package of claim 5, further comprising:
a first input matching network electrically connected to the gate terminal of the first die;
a second input matching network electrically connected to the gate terminals of the second and third dies;
a first output matching network electrically connected to the drain terminal of the first die; and
a second output matching network electrically connected to the drain terminals of the second and third dies.

7. The semiconductor device package of claim 6, wherein the first input matching network comprises a first capacitor electrically connected to the second lead and to the gate terminal of the first die, and wherein the second input matching network comprises second and third capacitors electrically connected to the fourth lead and to the gate terminals of the second and third dies.

8. The semiconductor device of claim 6, wherein the electrical connections between the first and second input matching networks and the respective gate and drain terminals of the first, second and third dies comprise bonding wires.

9. The semiconductor device of claim 8, further comprising a lid adjoining the top surface so as to provide an interior cavity over the chip mounting area, wherein the first and second input and output matching networks and the bonding wires are arranged within the interior cavity.

10. The semiconductor device of claim 4, wherein each of the first, second and third dies are substantially identical in size such that a ratio between the total die area of the peaking amplifier to the total die area main amplifier is approximately 2 to 1, and such that a ratio between the area of the second and first chip mounting sections is approximately 2 to 1.

11. The semiconductor device of claim 10, wherein a ratio between the width of the third and fourth leads to the width of the first and second leads is approximately 2 to 1.

12. A packaged Doherty amplifier, comprising:
a solid metal base comprising a top surface;
an electrically conductive chip mounting area on the top surface, the chip mounting area divided into first and second chip mounting sections;
a main amplifier affixed to the top surface completely within the first area;
a peaking amplifier affixed to the top surface completely within the second area;
first and second conductive leads electrically connected to gate and drain terminals of the main amplifier, the first and second leads laterally extending away from the base in opposite directions; and
third and fourth conductive leads electrically connected to gate and drain terminals of the peaking amplifier, the third and fourth leads laterally extending away from the base in opposite directions,
wherein a die area of the main amplifier is less than a die area of the peaking amplifier, wherein a die width of the main amplifier is less than a die width of the peaking amplifier,
wherein an area of the first chip mounting section corresponds to the die area of the main amplifier,
wherein an area of the second chip mounting section corresponds to the die area of the peaking amplifier,
wherein a width of the first and second leads corresponds to the die width of the main amplifier, and
wherein a width of the third and fourth leads corresponds to the die width of the peaking amplifier.

13. The packaged Doherty amplifier of claim 12, wherein the main amplifier comprises a first die and the die width of the main amplifier corresponds to a width of the first die, and wherein the peaking amplifier comprises second and third dies and the die width of the peaking amplifier corresponds to a collective width of the second and third dies.

14. The packaged Doherty amplifier of claim 13, wherein a ratio of the die width of the peaking amplifier to the die width of the main amplifier is approximately 2 to 1, and wherein a ratio of the width of third and fourth leads to the width of the first and second leads is approximately 2 to 1.

15. The packaged Doherty amplifier of claim 14, wherein a ratio of the area of the second section to of the area of the first section is approximately 2 to 1.

16. A packaged RF power amplifier, comprising:
a solid metal base comprising a top surface;
an electrically conductive chip mounting area on the top surface, the chip mounting area divided into first and second chip mounting sections;
a first amplifier affixed to the top surface completely within the first area;
a second amplifier affixed to the top surface completely within the second area;
first and second conductive leads electrically connected to gate and drain terminals of the first amplifier, the first and second leads laterally extending away from the base in opposite directions; and
third and fourth conductive leads electrically connected to gate and drain terminals of the second amplifier, the third and fourth leads laterally extending away from the base in opposite directions,
wherein a die area of the first amplifier is less than a die area of the second amplifier, wherein a die width of the first amplifier is less than a die width of the second amplifier,
wherein an area of the first chip mounting section corresponds to the die area of the first amplifier,
wherein an area of the second chip mounting section corresponds to the die area of the second amplifier,
wherein a width of the first and second leads corresponds to the die width of the first amplifier, and
wherein a width of the third and fourth leads corresponds to the die width of the second amplifier.

* * * * *

UNITED STATES PATENT AND TRADEMARK OFFICE
CERTIFICATE OF CORRECTION

| | | |
|---|---|---|
| PATENT NO. | : 9,209,116 B1 | Page 1 of 1 |
| APPLICATION NO. | : 14/297189 | |
| DATED | : December 8, 2015 | |
| INVENTOR(S) | : Komposch et al. | |

It is certified that error appears in the above-identified patent and that said Letters Patent is hereby corrected as shown below:

In the claims

Column 10, line 33 claim 15 line 2 change "to of the" to -- to the --

Signed and Sealed this
Twenty-ninth Day of March, 2016

Michelle K. Lee
*Director of the United States Patent and Trademark Office*